United States Patent [19]
Kano et al.

[11] 3,950,094
[45] Apr. 13, 1976

[54] BOTH-SIDE PRINTING DEVICE

[75] Inventors: Ichiro Kano, Yokohama; Hideki Yoshinari, Kawasaki, both of Japan

[73] Assignee: Canon Kabushiki Kaisha, Tokyo, Japan

[22] Filed: June 12, 1974

[21] Appl. No.: 478,892

[30] Foreign Application Priority Data
June 18, 1973 Japan................................ 48-68439

[52] U.S. Cl.................................. 355/45; 355/46
[51] Int. Cl.² ........................................ G03B 13/28
[58] Field of Search........................ 355/44, 45, 46

[56] References Cited
UNITED STATES PATENTS
3,794,421  2/1974  Kano................................... 355/45

Primary Examiner—Richard M. Sheer
Attorney, Agent, or Firm—Toren, McGeady and Stanger

[57] ABSTRACT

A both-side printing device which adjusts the mutual position of patterns to a predetermined relation and prints the patterns on the both sides of a both-side sensitive body of a predetermined thickness, in which the relation of the mutual position of individual patterns to be formed on the both-side sensitive body can be detected prior to the both-side printing by imaging one pattern on a mask of other pattern or on a plane having the other pattern formed thereon, and thereby alignment of the two patterns can be effected.

11 Claims, 2 Drawing Figures

BOTH-SIDE PRINTING DEVICE

BACKGROUND OF THE INVENTION

1. Field of the Invention

The present invention relates to a both-side printing device which adjusts the mutual position of patterns to a predetermined relation and prints the patterns on both sides of a both-side sensitive body of a predetermined thickness, in which the relation of the mutual position of individual patterns to be formed on the both-side sensitive body can be detected prior to the both-side printing.

2. Description of the Prior Art

In a both-side printing device which adjusts the relation among mutual positions of individual patterns and prints the patterns on both-sides of a both-side sensitive body, it is necessary to observe or detect the relation of mutual positions of patterns to be formed on both sides of a sensitive body prior to the printing.

Various methods have been proposed for observing the positional relation, but none of these methods have been successful.

Descriptions will be made hereinunder on one of the typical prior arts.

Prior to the printing, a non-transparent sheet, instead of a sensitive body, having the same thickness as the sensitive body is arranged at the position on which the sensitive body is to be put, and a microscope objective lens for observing both patterns to be formed on the both sides of the non-transparent sheet is arranged. However, this method has a defect that proper correspondence of the non-transparent sheet to the view fields is very hard to obtain.

According to another conventional method, patterns are formed by the light transmitted through a sensitive material and the pattern on one side is compared with the pattern on the other side. This method has a defect that proper comparison of the patterns can not be obtained.

SUMMARY OF THE INVENTION

One object of the present invention is to provide a both-side printing device which eliminates the above defects of the prior art and can compare properly the patterns to be formed on both sides.

The above object of the present invention can be attained by imaging one pattern on the plane on which the other pattern is formed, or on a mask of the other pattern and by observing the both patterns by one microscope.

In order to image one pattern on the plane on which the other pattern is formed, or on a mask of the other pattern, a glass having parallel planes and having a predetermined refractive index and a larger thickness than a sensitive material is arranged in an optical path of an imaging optical system for imaging the other pattern on the sensitive material, and the imaging position is shifted to the plane on which the other pattern is formed, or the mask of one pattern and the imaging optical system are shifted together, or the imaging optical system (this optical system shifts the imaging position but does not change the magnification of the image) is replaced with other imaging optical system, or an image-position variable lens which does not change the image magnification but shifts only the imaging position is used in the imaging optical system.

The defects of the conventional methods can be eliminated by optically shifting the imaging position of one pattern to the plane on which the other pattern is formed or to the mask of one pattern and by observing the both patterns by the same microscope, because the alignment of the observation field is not necessary.

The present invention will be described in more details referring to the attached drawings.

Figure 1:
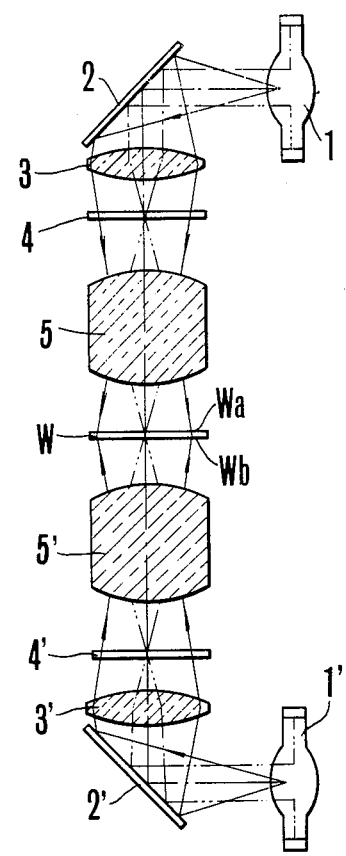
FIG. 1 is a cross sectional view showing schematically one embodiment of the both-side printing device of the present invention at the time of printing.

In FIG. 1, a wafer W is a sensitive material having a predetermined thickness with a first surface Wa and a second surface Wb. According to an embodiment of the invention, both of the surfaces are ground and applied with a photo-resist layer. This wafer is movably arranged at a predetermined position by suitably positioning means. Reference numerals 1 and 1' indicate respective printing light source, 2 and 2' denote respective optical path variation mirrors, 3 and 3' denote respective condensor lenses. A printing mask 4 forms a pattern to be printed on the first surface Wa, and a printing mask 4' forms a pattern for the second surface Wb. These masks 4 and 4' are movably supported by a suitable supporting member so as to change their positions. Numerals 5 and 5' each denote a projector lens system in which the printing masks 4 and 4' are arranged at a position on a plane conjugate to the surfaces Wa and Wb of the wafer W.

These masks 4 and 4' are irradiated respectively by the light flux from the printing light sources 1 and 1' through the optical path variation mirrors 2 and 2' and the condensor lens 3, thus desired patterns are simultaneously printed on the surfaces of the wafer. These patterns form images separated from each other by the thickness of the wafer. At this time, the patterns printed on the both sides must have a predetermined positional relation. Alignment of their relative positions will be described referring to FIG. 2.

Figure 2:
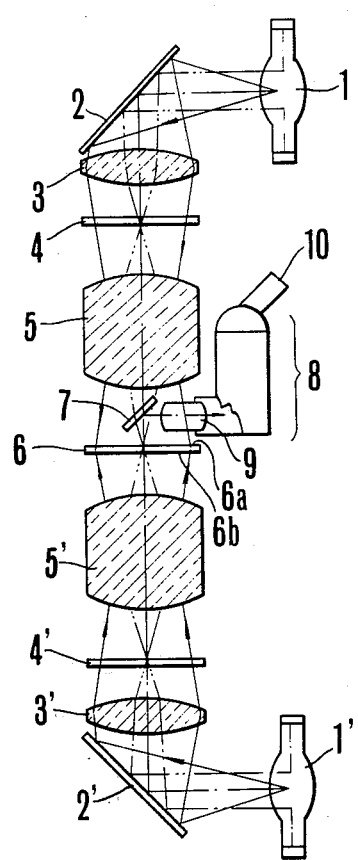
FIG. 2 is a cross sectional view showing schematically the device shown in FIG. 1 at the time of alignment.

In FIG. 2, a dummy wafer 6 is transparent with respect to the mask illuminating light. Reference character 6a represents a first surface, 6b a second surface, 7 a half mirror, 8 an alignment microscope (alignment-scope), 9 an object lens and 10 an ocular. The other members are same as in FIG. 1.

The dummy wafer 6 or the alignment-scope 8 are inserted into the optical path only during alignment. When the dummy wafer is in the optical path, the wafer W is removed from the optical path (FIG. 1). The dummy wafer 6 is arranged in such a manner that its first surface 6a is aligned with the first surface Wa of the wafer. The dummer wafer 6 is desirably made of hard transparent material such as glass and satisfies the followng relation;

$$t_w = t_p ( 1 - 1/n )$$

in which $t_p$ is its thickness, $n$ is its refractive index and $t_w$ is the thickness of the wafer W.

Thus, the pattern to be formed on the surface Wb of the wafer W is imaged on the surface 6a. This is due to the fact that the imaging position is shifted by the difference of refractive index caused by the glass. The surface 6a of the dummy wafer constitutes a half mirror so as to reflect and permit observation of the projected pattern.

At the time of alignment, in addition to the dummy wafer 6, the alignment-scope 8 and the half mirror 7 for introducing the light to the alignment-scope are inserted between the first surface 6a and the projector lens system 5. The half mirror 7, may for example be a pellicle mirror about 10μ thick so that abberation or focal movement caused by the half mirror is negligible.

The pattern of the first surface printing mask 4 is imaged on the first surface 6a of the dummy wafer through the projector lens system 5, and is reflected thereon and observed through the half mirror 7, the objective lens 9 and the ocular 11. When the dummy wafer 6 is not inserted, the image of the second surface printing mask 4' is formed at the position of the second surface Wb of the wafer W. Thus it is not possible to adjust the mutual positions of the individual images. However, when the dummy wafer 6 is inserted, the image at the position of the second surface is moved to the position of the first surface by the dummy wafer itself so that the images aligned on the first surface are observed simultaneouslsy because the refractive index and the thickness of the dummy wafer and the wafer thickness are related as mentioned before. Thus, by moving either of the first surface printing mask or the second surface mask within their plane it is possible to obtain accurate alignment of the both patterns. Then, when the dummy wafer 6 is taken out and the wafer W is inserted, it is possible to print the both patterns. Also it is possible to print in alignment with the patterns already printed on the wafer surface by moving the wafer W within its aligned plane without adjusting the printing masks to the first and the second surfaces.

As for the position of observation, the observation can be done also when the alignment-scope 8 and the half mirror 7 are inserted between the printing mask and the condensor lens. For example, when the microscopic observation system is arranged between the condensor lens 3 and the printing mask 4 of the first surface printing optical system, the pattern of the mask 5' is formed on the dummy wafer 6 by the projector lens system 5', and this image is further reimaged on the mask 5 by the projector lens 5, and thus the image of the mask 5 and the reimaged image of the mask 5' are simultaneously observed so that alignment is possible. In this case, however, it is not necessary that the one side of the dummy wafer is half-transparent, but it is necessary that an optical system such as a telecentric optical system which impinges the main light ray perpendicularly on the wafer surface, because enough light flux is introduced to the first surface projector system from the second surface projector lens system.

The observation means of the device of the present invention can be used not only for a printing device which projects patterns on both sides, but also for a both-side printing device in which one mask is closely contacted to the wafer and the other mask pattern is projected. Namely, in place of the wafer, a dummy wafer is arranged and the projected pattern and the pattern on the mask are observed and aligned.

In the above embodiments of the present invention, descriptions have been made of the case where the first surface 6a of the dummy wafer 6 is provided with a half-transparent surface, but the half-transparent surface may be arranged on the second surface 6b or in the dummy wafer 6, and furthr the half-transparent surface and the glass may be arranged separately.

In the above descriptions, it has been stated only the glass sheet is necessary when alignment is done on the mask 4, but in this case the glass sheet may be placed at any position so far as the position is behind the projector lens 5'.

In the embodiments shown in FIGS. 1 and 2 the parallel plane plate is used in order to shift the image, it is also permitted that the image is shifted by the distance corresponding to the wafer thickness maintaining the second projector systems 1', 2', 3', 4' and 5' in the same relation thanks to the feature of the present invention that the pattern of one mask is shifted to the surface on which the other pattern is formed or on the other mask. In this case, only the mask 4' and the projector lens 5' are required. Further, when the projector lens 5' is replaced by other lens or when the lens 5 is replaced by a focal-point variable lens, the image can be shifted.

What is claimed is:

1. A printing device for printing patterns on both sides of a photosensitive material of predetermined thickness, comprising first optical means arranged for forming a first image of a first pattern on a plane corresponding to a position at which one side of a photosensitive material is to assume, second optical means arranged for forming a second image of a second pattern on a second plane spaced from the first plane corresponding to a position at which a second side of a photosensitive material is to assume, observation means for observing images in the first plane; and image shifting means between said first and second optical means for shifting the image formed in the second plane to the first plane.

2. A device as in claim 1, wherein said image shifting means includes a transparent plate having one surface positioned at the first plane and a thickness equal to $$t_p = \frac{t_w}{\left(1 - \frac{1}{n}\right)},$$

where $t_w$ is the predetermined thickness of the photosensitive material and where $n$ is the index of refraction of the plate.

3. A device as in claim 2, wherein the plate forms a half-mirror in the first plane.

4. A printing device for printing pattern on both sides of a photo-sensitive material of a predetermined thickness comprising:

first imaging optical means for forming a first pattern of a first mask on a first surface of a photosensitive material.

second forming optical means for imaging a second pattern of a second mask on a second surface opposite to said first surface of a photo-sensitive material, the plane containing said first surface forming a standard plane the plane containing said second surface forming an imaging plane separated from said standard plane a distance equal to the predetermined thickness of a photosensitive material, optical image shifting means movable into and out of a position between said first and second optical means for shifting said second pattern formed on said imaging plane to said standard plane when the shifting means is moved into a position between said first and second optical means, and observation means for observing said first pattern on the standard plane and said second pattern which is shifted to standard plane.

5. A printing device according to claim 4, in which the observation means is a microscopic optical system.

6. A printing device according to claim 4, in which the image shifting means is a parallel plane sheet having a predetermined refractive index and thickness.

7. A printing device according to claim 6, in which the parallel plane sheet is a glass sheet.

8. A printing device for printing pattern on both sides of a photo-sensitive material of a predetermined thickness, comprising:
- a first image projection optical means for imaging a first pattern of a first mask on a first plane corresponding to a position a first surface of a photosensitive material is to assume;
- a second image projection optical means for imaging a second pattern of a second mask on a second plane spaced from the first plane corresponding to a position a second surface opposite to said first surface of a photo-sensitive material is to assume;
- a partially transparent mirror having a surface at the first plane and having means for optically shifting the image on the second plane onto the first plane; and
- observation means for observing both of the images on the first plane.

9. A printing device for printing pattern on both sides of a photo-sensitive material of a predetermined thickness comprising:
- a first image projection means for imaging a first pattern of a first mask on a first plane,
- a second image projection means for imaging a second pattern of a second mask on a second plane spaced from the first plane,
- a partially transparent mirror means which is insertable at the time of alignment in the first plane,
- an image shifting means between said second projection means and said mirror means for shifting said second pattern formed on the second plane to the first plane,
- an observation means for observing said first pattern and said shifted second pattern on the first plane.

10. A printing device according to claim 9, in which the image shifting means is a parallel plane transparent plate having a predetermined reflective index and thickness.

11. A printing device according to claim 10, in which the plate is a glass plate.

* * * * *